(12) United States Patent
Iwamasa

(10) Patent No.: US 7,086,037 B2
(45) Date of Patent: Aug. 1, 2006

(54) METHOD AND COMPUTER PROGRAM PRODUCT FOR LOCALIZING AN INTERRUPTION STRUCTURE INCLUDED IN A HIERARCHICAL STRUCTURE OF A SPECIFICATION

(75) Inventor: Mikito Iwamasa, Tokyo (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 650 days.

(21) Appl. No.: 10/059,199

(22) Filed: Jan. 31, 2002

(65) Prior Publication Data
US 2004/0015825 A1   Jan. 22, 2004

(30) Foreign Application Priority Data
Jan. 31, 2001   (JP)   ............... 2001-024888

(51) Int. Cl.
*G06F 9/44* (2006.01)
(52) U.S. Cl. .................. 717/132; 717/127; 717/135
(58) Field of Classification Search ......... 717/124–135
See application file for complete search history.

(56) References Cited

U.S. PATENT DOCUMENTS

| | | | | |
|---|---|---|---|---|
| 5,093,914 A * | 3/1992 | Coplien et al. | ............. | 717/129 |
| 5,221,973 A * | 6/1993 | Miller et al. | ................ | 358/468 |
| 5,263,153 A * | 11/1993 | Intrater et al. | ................ | 714/51 |
| 5,758,168 A * | 5/1998 | Mealey et al. | ............... | 710/260 |
| 5,835,922 A * | 11/1998 | Shima et al. | ................ | 715/522 |
| 5,937,190 A * | 8/1999 | Gregory et al. | ............. | 717/131 |
| 6,016,474 A * | 1/2000 | Kim et al. | .................. | 717/125 |
| 6,202,199 B1 * | 3/2001 | Wygodny et al. | ........... | 717/125 |
| 6,226,787 B1 * | 5/2001 | Serra et al. | ................. | 717/125 |
| 6,240,545 B1 * | 5/2001 | Carmichael et al. | ........ | 717/128 |
| 6,748,583 B1 * | 6/2004 | Aizenbud-Reshef et al. | .......................... | 717/127 |
| 6,751,789 B1 * | 6/2004 | Berry et al. | ................. | 717/130 |
| 2001/0020293 A1 * | 9/2001 | Uchihira et al. | ............... | 717/4 |

OTHER PUBLICATIONS

News Release, "Microsoft Signs Corporate Agreement with Mutek Solutions Towards Extensive Use of Bugtrapper TM Development Tool Worldwide", PRNewsWire, Apr. 7, 1999.*

Edward Colbert, Absolute Software Co., Inc. "How RapidPLUS Speeds Development of Embedded Systems that Satisfy Customers". pp. 1-13.

* cited by examiner

*Primary Examiner*—Ted T. Vo
(74) *Attorney, Agent, or Firm*—Oblon, Spivak, McClelland, Maier & Neustadt, P.C.

(57) ABSTRACT

This invention is applied to a system design support system which handles at system level, e.g., a specification for software executed by a computer, a specification for hardware combined with semiconductor devices and the like, a specification for an embedded system constituted by a combination of software and hardware, and a specification for a business process such as a work flow. A consideration is given to difficulty in efficiently implementing an interrupt in a specification created in a system description language in such a case where the interrupt is defined at a lower level which is structurally separate from a portion where the interrupt actually occurs. An interrupt structure localizing apparatus specifies a portion in a system-level specification in which an interrupt actually occurs and localizes the portion, thereby obtaining a specification structure in which an interrupt does not occur across hierarchical structures.

15 Claims, 9 Drawing Sheets

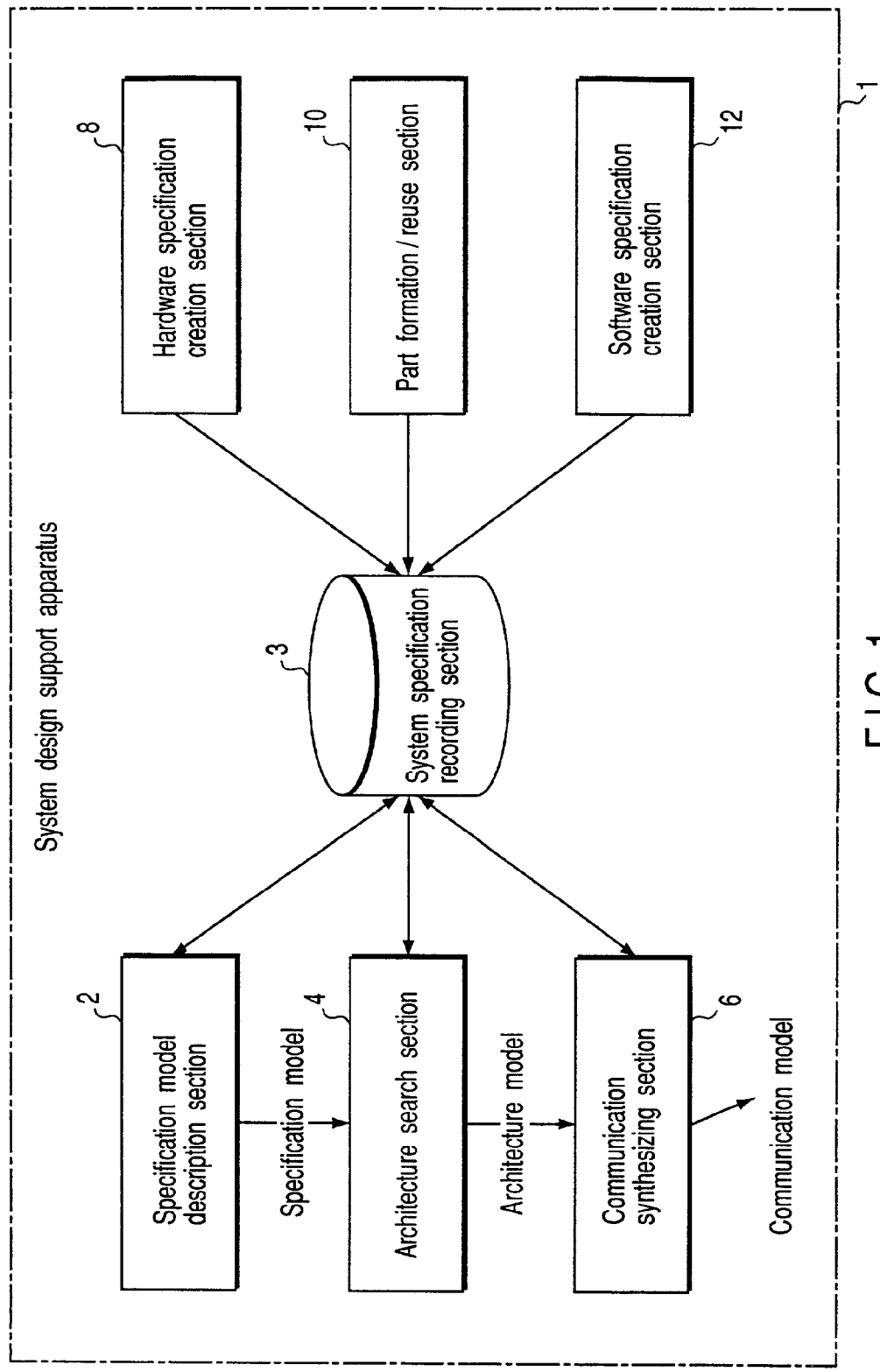
F I G. 1

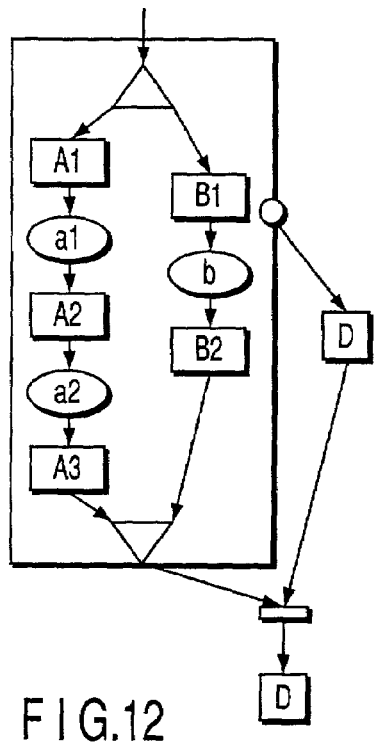
F I G. 12
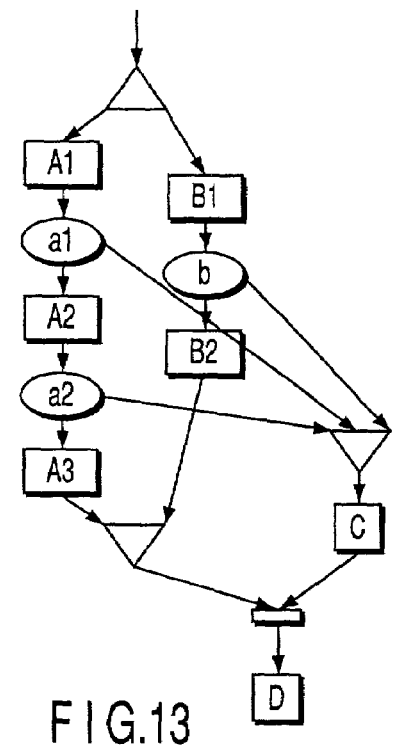
F I G. 13
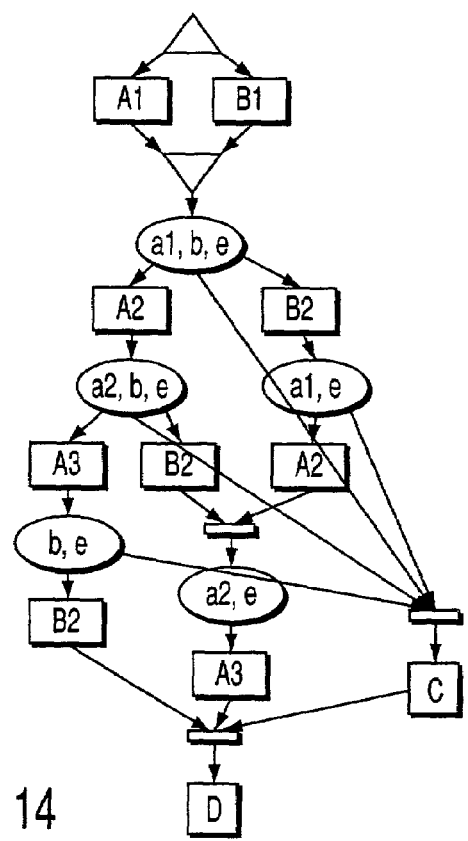
F I G. 14

METHOD AND COMPUTER PROGRAM PRODUCT FOR LOCALIZING AN INTERRUPTION STRUCTURE INCLUDED IN A HIERARCHICAL STRUCTURE OF A SPECIFICATION

CROSS-REFERENCE TO RELATED APPLICATIONS

This application is based upon and claims the benefit of priority from the prior Japanese Patent Application No. 2001-24888, filed Jan. 31, 2001, the entire contents of which are incorporated herein by reference.

BACKGROUND OF THE INVENTION

1. Field of the Invention

The present invention relates to design support for hardware such as a computer and electronic device, software, and a system including a combination of hardware and software.

2. Description of the Related Art

Recently, a system specification description language for describing a specification at system level without discrimination between hardware and software has been developed. With this development of the language, an environment for consistent specification description from a specification at system level to specified software or hardware specifications based on the same specification format has been improving. With the advent of such system specification description languages, several new design methodologies have been proposed.

A rapid prototyping tool (Rapid or BetterState) is known, which provides a design environment in an upstream stage of system design while checking a system specification.

A characteristic feature of such a rapid prototyping tool is that system analysis and design can be seamlessly and quickly performed by using hierarchical state transition diagrams. From the viewpoint of specification design at system level at which a specification implementation method is not clear, this tool has a merit of allowing efficient design by hierarchically combining interrupt execution, sequential execution, and parallel execution. In addition, products in other upstream system analysis processes can be easily converted into the corresponding system-level specification descriptions.

On the other hand, these techniques have a weak point in a detailing process accompanying implementation of designed specifications. For example, in implementation of software using a programming language such as the C language or implementation of hardware using HDL (Hardware Description Language) or the like, concepts such as "parallel" and "interrupt" which these implementation languages do not directly embed must be translated by the corresponding implementation language. Such operation is not necessarily efficient. This problem becomes noticeable when a system specification is complicated due to a hierarchical combination.

BRIEF SUMMARY OF THE INVENTION

It is an object of the present invention to efficiently obtain a specification, on the basis of a system-level specification, which is detailed enough to be implemented in a downstream stage of design. More specifically, it is an object of the present invention to provide a method and computer program product which are suitably used to detail a system-level specification created in a system description language and localize an interrupt structure contained in a structural system-level specification.

According to one aspect of the present invention, there is provided a method for localizing an interruption structure included in a hierarchical structure of a specification described in a system description language, the method comprising: specifying an interruptible portion in the hierarchical structure of the specification based on a code of the specification;

segmenting the specification into a plurality of parts including no interruptible portion interruptible at the specified interruptible portion; and localizing the interruption structure to the interruptible portion which belongs to lower-level of the hierarchy than the level of the hierarchy at which the interruption structure of the specification is defined.

BRIEF DESCRIPTION OF THE SEVERAL VIEWS OF THE DRAWING

FIG. 1 is a block diagram showing the schematic arrangement of a system design support apparatus according to an embodiment of the present invention;

FIG. 12 is a view showing an example of a parallel interrupt structure in the ETG notation;

FIG. 13 is a view showing a localization result on an interrupt with respect to the parallel interrupt structure in the ETG notation;

FIG. 14 is a view showing a parallel synthesis result in the ETG notation; and

DETAILED DESCRIPTION OF THE INVENTION

Figure 2:
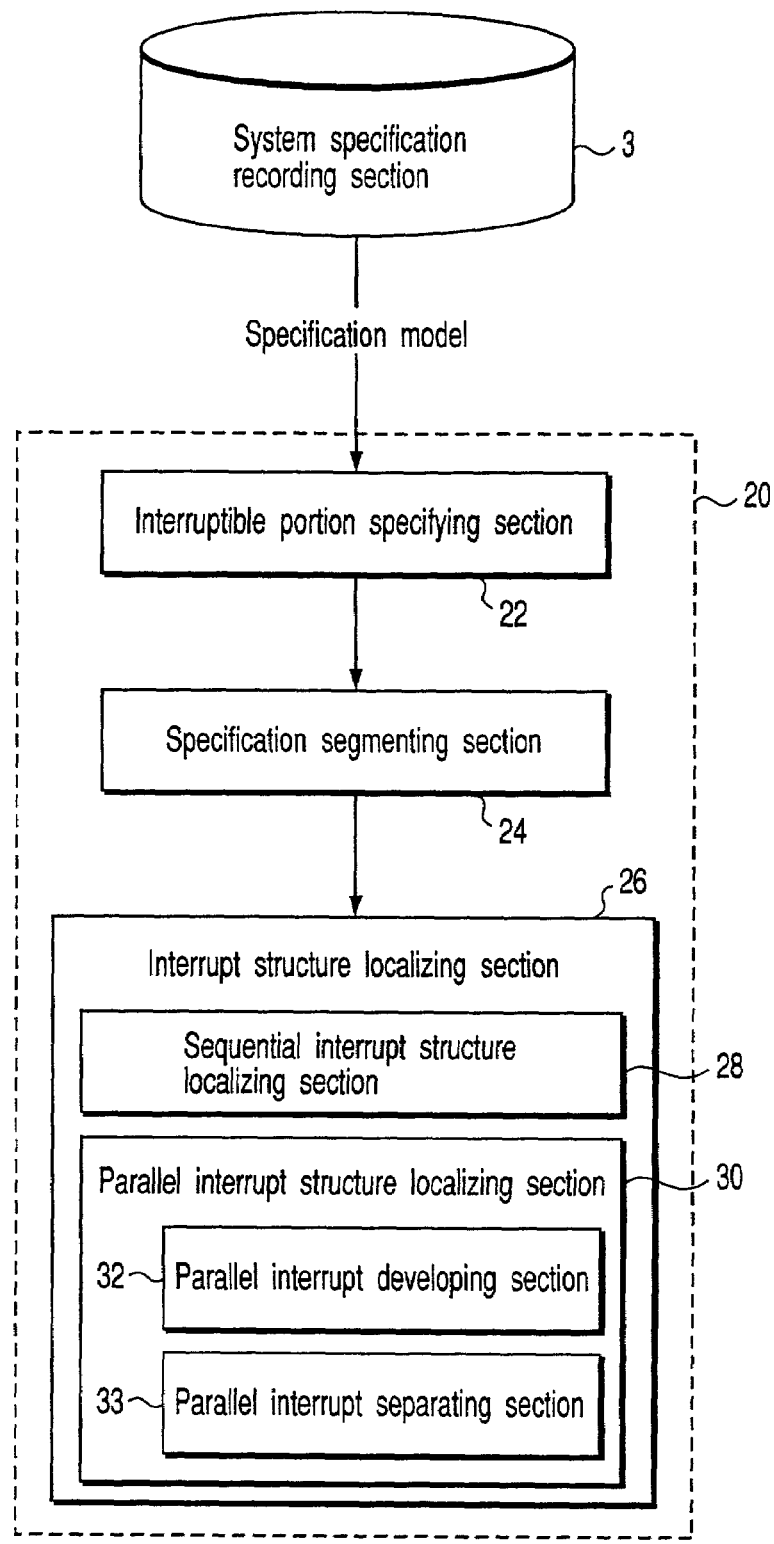
FIG. 2 is a block diagram showing the schematic arrangement of an interrupt structure localizing apparatus applied to the above system design support apparatus.

An embodiment of the present invention will be described below with reference to the views of the accompanying drawing.

FIG. 1 is a block diagram showing the overall arrangement of a system design support apparatus to which an interrupt structure localizing apparatus according to an embodiment of the present invention is applied.

A system design support apparatus 1 shown in FIG. 1 is comprised of a specification model description section 2, system specification recording section 3, architecture search section 4, communication synthesizing section 6, hardware specification creation section 8, part formation/reuse section 10, and software specification creation section 12.

The system design support apparatus 1 of this embodiment handles at system level, e.g., a specification for software executed by a computer, a specification for hardware combined with semiconductor devices and the like, a specification for an embedded system constituted by a combination of software and hardware, and a specification for a business process such as a work flow.

The specification model description section 2, which is used to design a specification model comprised of specifications for calculation and communication in such specifications at system level, is a section for supporting a designer to describe specifications. When the designer describes specifications for calculation contents and communication contents according to a predetermined specification description form, a specification description model is created. This specification description model includes a specification structure to be described later. Examples of the specification description form are a structured text form represented by a structured programming language, a structural chart form using graphs, and a table form using tables.

The architecture search section 4 divides a partial structure of a supplied specification description model into elements and distributing the elements to architecture elements while maintaining the contents of the specification in consideration of an architecture (the arrangement of a hardware/software implementation environment). More specifically, parts (the constituent elements of a specification description model) constituting specifications for calculation contents and communication contents designed by the specification model description section 2 are assigned to architecture elements (creation of an architecture model).

The communication synthesizing section 6 synthesizes communication procedures between specification elements on an architecture. More specifically, the communication synthesizing section 6 inserts a communication procedure (protocol) between communication specification elements distributed by the architecture search section 4 and performs protocol conversion (rearrangement of a communication procedure) to match with a communication procedure in which the communication content specification is inserted (creation of a communication model).

The system specification recording section 3 associates the specification model created by the specification model description section 2, the architecture model created by the architecture search section 4, and the communication model created by the communication synthesizing section 6 with each other, and records the resultant data as a system specification.

The hardware specification creation section 8 creates a hardware specification from the system specification recorded on the system specification recording section 3. The software specification creation section 12 creates a software specification from the system specification recorded on the system specification recording section 3.

The part formation/reuse section 10 forms the system specification recorded on the system specification recording section 3 into parts and provides them for reuse in design processes in the specification model description section 2, architecture search section 4, and communication synthesizing section 6.

The interrupt structure localizing apparatus according to this embodiment is embedded as an apparatus for localizing an interrupt structure in advance in the system design support apparatus 1 to facilitate specification segmentation in the architecture search section 4.

FIG. 2 is a block diagram showing the schematic arrangement of the interrupt structure localizing apparatus. As shown in FIG. 2, an interrupt structure localizing apparatus 20 is comprised of an interruptible portion specifying section 22, specification segmenting section 24, and interrupt structure localizing section 26. The interrupt structure localizing section 26 is comprised of a sequential interrupt structure localizing section 28 and parallel interrupt structure localizing section 30. The parallel interrupt structure localizing section 30 includes a parallel interrupt developing section 32, and parallel interrupt separating section 33.

The system design support apparatus 1 of this embodiment includes at least description elements for describing "sequential execution", "repetitive execution", "interrupt end", "interrupt pause", and "parallel execution", and can describe an overall system specification by hierarchically combining these description elements.

System specification description schemes include StateChart for graphically describing specifications, SpecC (Specification description language based on C) language that expresses specifications in characters as a structural language, and the like. SpecC is described in detail in, for example, Daniel D. Gajski, "SpecC: Specification Language and Methodology", Kluwer Academic Publishers, Dordrecht, ISBN0-7923-7822-9.

In this embodiment, a system specification description scheme will be described below with reference to a description form based on the SpecC language. However, the present invention is not limited to the SpecC language.

<Structure of Specification>

In this embodiment, a specification is comprised of a plurality of basic units called "behaviors". A behavior can have a hierarchical structure. That is, one behavior can have a plurality of other behaviors as lower-level behaviors. A behavior corresponds to a function or class in a software specification; an LSI block in a hardware specification; and a job or task in a business process specification.

"Structure of specification" defines the structure of a specification constituted by behaviors, and is comprised of a hierarchical structure associated with the execution order of behaviors and a hierarchical structure associated with data communication channels between the behaviors. The structure associated with the execution order and the structure associated with the communication channels have the same structure from the hierarchical viewpoint. More specifically, if behavior A is hierarchically higher than behavior B in terms of execution order, behavior A is also hierarchically higher than behavior B in terms of communication channels.

Depending on the structure of a specification, a specification dividing method for an architecture can also be defined. For example, with regard to an embedded system, the manner in which a specification is divided into portions corresponding to hardware and software is structured and described as a specification.

<Format of Specification>

Of the specification of a specification, a structure associated with an execution order is expressed as a hierarchical structure using at least four classifications of syntactic elements, namely "sequential execution and repetitive execution" (fsm), "parallel execution" (par), "synchronous execution" (fork, join, start, end), and "interrupt execution" (try, trap, itrp). Note that fsm is an abbreviation for finite state machine.

For example, fsm{a, b} expresses a specification stating that "b is executed after a is executed and completed"

par{a, b} expresses a specification stating that "a and b are concurrently executed"

The hierarchical specification, fsm{a, par{b, c}, d}, expresses a specification stating that "b and c are concurrently executed after execution of a, and d is executed after both b and c are completed"

In addition, try{a}trap(e){b} as a specification associated with "interrupt execution" expresses a specification stating that "a is executed first. If event e occurs during execution of a, execution of a is forcibly ended, and execution of b is started"

"Sequential execution and repetitive execution", "parallel execution", "synchronous execution", and "interrupt execution" are necessary minimum elements as means for execution control method definition which are used to describe software, hardware, and business process specifications. A so-called system specification is described by hierarchically combining these elements.

A structure associated with communication channels defines the exchange of data between behaviors. Assume that communication channels are expressed by parts called variables and channels. Variables and channels are defined as parts immediately subordinate to higher-level behaviors in a hierarchical relationship in a specification, and the higher-level behaviors are connected to lower-level behaviors through connection ports called ports, thereby allowing the lower-level behaviors to communicate with each other through communication channel.

A communication channel corresponds to a variable or a function for communication in a software specification and to an interconnection for connecting LSIs in a hardware specification. A port is an input/output port for communication, which corresponds to an argument in a software specification and to a terminal for connecting parts through an interconnection in a hardware specification. A channel is a part for receiving a command specially prepared to transmit/receive data. For example, commands such as "put (data)" and "get( )" are conceivable. A variable can be regarded as a kind of channel having a write "write(data)" command and read "read( )" command.

Simple syntactic elements and rules of the SpecC language will be described below.

system description=set of "behavior descriptions"
behavior description={communication element, . . . , processing content}
where communication element=variable, channel
processing content=behavior(port, . . . ), execution procedure description execution procedure description = *fsm{...}, par{...}*,
= *try{...}trap(e){...}itrp(e){...}*

In the behavior description sample {i, j, k, fsm{A(i), B(j), C(k)}, i, j, and k are local variables, and A, B, and C are lower-level behaviors, each having a port, which is connected to a local variable.

par{A, B, C}

This processing content sample indicates that A, B, and C are concurrently executed.

--- fsm{{1, A, goto(2)},
{2, B, flg==3: goto(1), flg==1: goto(2)}
}

---

In this case, each element of fsm is formed by any one of
{label, processing content, {condition: transition upon establishment of condition}, . . . },
{label, processing content, transition upon completion of processing, . . . },
{label, processing content} and processing content These elements are sequentially executed from the left unless otherwise specified. If there is no transition label item, {label, processing content} executes the next fsm element upon completion of the processing content. Assume that label=1 or the leftmost fsm element is executed first. A transition is expressed by "goto(x): X is label number". For example, goto(1) indicates that the flow returns to the first fsm element.

The above case indicates the following operation. When A is executed and completed, B is executed. When B is completed, A is executed if the value of the variable flg is 3, and B is executed if the value is 1.

As in the following example, an element without any label can be regarded as a simplified form of given execution control using a label.

fsm{A, B, C}=fsm{{1, A, goto(2)}, {2, B, goto(3)}, {3, C, . . . }, . . . }.

try{A}trap(ev1){B}itrp(ev2){C}

In the case of this language element, A is executed first. If event ev1 occurs during execution of A, A is forcibly ended, and B is executed. If event ev2 occurs during execution of A, A is paused, and C is executed. When C is completed, A is resumed.

Note that each of trap(e){X} and itrp(e2){Y} may be more than one.

wait(ev)

This is synchronous processing which waits for the occurrence of event ev.

notify(ev)

This is synchronous processing that causes event ev.

flg=X

This is a substitution of a value into variable flg.

flg==X

This is condition determination.

start(ID);
fork(ID);

This is synchronous processing I; start and fork are synchronous executed.

end(ID);
join(ID);

This is synchronous processing II; end and join are synchronous executed.

The following is a specification sample conforming to the format enumerated above and having a hierarchical structure:

(Example: ex0)
A:={i, par{B(i), g(i)}}
B(i):={j, k, fsm{a(j), b(k, i), C(k)}>}
C(k):={par{d, e, f(k)}}

This expresses the following specification:

"Behavior A is constituted by sub-behaviors B, C, g, a, b, e, and f, and behavior A is constituted by lower levels B and g. B and g are concurrently executed. B, which is hierarchically lower than A, is constituted by lower-level elements a, b, and C, which are sequentially executed. C, which is hierarchically lower than B, is constituted by lower-level elements d, e, and f, which are concurrently executed. A has communication channel i, and port i of B and is connected to port i of g through i. B has communication channels j and k, port j of lower-level element a is connected to communication channel j. Port k of b is connected to communication channel k, port i of b is connected to port i of B, port k of C is connected to communication channel k, and port k of C is connected to port k of f. That is, a behavior f and behaviors b, g and b are connected through communication lines, respectively, to exchange data across hierarchical levels."

For the sake of descriptive convenience, consider a case where communication channels and a hierarchical relationship are simplified in consideration of the execution order. When, for example, the above specification example (ex0) is simplified in consideration of the execution order, a specification can be described as follows:

A:=par{fsm{a, b, par{d, e, f}}, g}

For the sake of descriptive convenience, consider a case where the execution order is simplified in consideration of communication channels and a connection relationship. When the above specification example (ex0) is simplified in consideration of the communication channels and connection relationship, a specification can be described as follows:

A:={i, bh{B(i), g(i)}}
B(k):={i, j, bh{a, (i), b(i, j), C(j) }>}
C(j):={bh{d, e, f(j)}}

Pairs of fork(x) and start(x), and end(x) and join(x) represent a synchronization constraint and define that these elements are always executed in pairs (in this case, x represents an id number, and a pair having identical id numbers are synchronously executed)

For example, the following specification:
par{fsm{1, fork(2), join(2), 3},
fsm{start(2), 2, end(2), 4}} hierarchically indicates that sequential executions (fsm) 1 to 3 and 2 to 4 are concurrently executed (par) Obviously, however, sequential execution 2 is executed between sequential executions 1 and 3 according to the synchronous relationship between for, join, start, and end.

With regard to the structure of communication channels, the above specification example (ex0) indicates that f and b can exchange data with each other through communication channel j of B, and a, b, and g can exchange data with each other through communication channel i of A.

<Specification Constraint>

Assume that in the system design support apparatus 1 of this embodiment, a constraint associated with a specification description is recorded on the system specification recording section 3, and it can be determined on the basis of this specification constraint whether to hold the contents of a specification.

<Description of Specification Associated with Interrupt>

In a description of a specification associated with an interrupt in the specification model description section 2, an interrupt that can be caused in an arbitrary time unit in a system execution time is called a preemptive interrupt. In a system-level specification description in this embodiment, an interrupt is allowed at only a predetermined portion of the specification. A predetermined portion of a specification is a portion unique to a specification description scheme or an arbitrary portion to which a designer assigns a mark for identifying the portion. Interruptible portions for preemptive interrupts densely exist throughout a specification. Many specification description languages have a mechanism of specifying such an interruptible portion. According to the SpecC language, for example, interrupts are allowed only at a wait statement or waitfor statement.

If, therefore, the following specification is provided, and behaviors A1, A2, and B do not include wait/waitfor elements,

```
try{
    fsm{A1, wait(e1, A2)}
}trap(e2) {B}
```

This specification indicates the following operation. First of all, A1 is executed, and no interrupt occurs during execution of A1. When A1 is completed, wait(e1) is executed. Since an interrupt can be caused by trap(e2) during execution of wait(e1), if event e2 occurs during this wait, wait is forcibly terminated by an interrupt, and B is executed. If e1 occurs during wait, this wait is terminated, and A2 is executed. No interrupt occurs during execution of A2.

<Specifying of Interrupt Portion>

The interruptible portion specifying section 22 specifies a portion including an interruptible portion (wait/waitfor in the case of SpecC) by searching the system specification recorded on the system specification recording section 3 for the internal structure of the specification (the specification described in the C language within a main function in the case of SpecC). This operation is realized by using a computer science technique called a syntactic analyzer (parser). Alternatively, the designer can specify an interruptible portion by inserting a mark (wait/waitfor in the case of SpecC) in a specification by using an interruptible portion specifying section. This operation is realized by using a specification editing function such as an editor technique.

<Segmentation of Specification at Interruptible Portion>

The specification segmenting section 24 segments a specification whose interruptible portion is specified at the interruptible portion. If, for example, an interruptible portion is detected in behavior A, behavior A is segmented into a plurality of behaviors at the interruptible portion. The divided behaviors are classified into a behavior containing no interruptible portion and a behavior constituted by only a minimum interruptible structure, i.e., a wait/waitfor element in the case of the SpecC language. Such specification segmentation is performed with respect to an interruptible behavior, i.e., a behavior containing a wait statement.

Assume that behavior A is subjected to sequential execution and contains wait(el) at some point.

fsm{A, B}
A==[f1; wait(e1); f2;]

Note that "A==[xxx; yyy; zzz;]" expresses the internal structure of a behavior, and a sequential execution processing list in the main function is segmented by ";".

If no interrupt occurs at f1 and f2, behavior A is segmented into three behaviors A1, A2, and A3 by the specification segmenting section.

A(segmentation)—>fsm{A1, A2, A3}
A1==[f1;], A2==[wait(e1);], A3==[f2;]

As described above, behavior A acquires an fsm structure having A1, A2, and A3 as lower-level behaviors.

If the internal structure of behavior A has a repetitive structure and a wait statement is contained in the repetitive structure, then

```
fsm{A, B}
A==[for(i=0; 1<10; i++) {f1; wait(e1); f2;}]
A(segmentation) ->fsm{
    A1,
    {1, A2}
    A3
    {A4, i<10:goto(1), i>=10:goto(2)},
    {2, EXIT}
}
```

A1=[i=0;], A2=[f1;], A3=[wait(e1);], A4=[f2;]

A new fsm structure is obtained by segmenting behavior A. Note that a conditional branch (if then else) is also subjected to specification segmentation by the same processing as described above.

<Localization of Interrupt>

With regard to an interrupt (try/trap/interrupt) with respect to a hierarchical structure, a range in which an interrupt is effective corresponds to a hierarchical structure lower than the level at which this interrupt is defined. For example, in the following interrupt structure try{A
}trap(e) {B} a range in which an interrupt caused by event e is effective corresponds only behaviors belonging to a level lower than behavior A at a level lower than try.

In consideration of this point, the interrupt structure localizing section 26 refers to the internal structure at a level lower than an interrupt definition level and localizes (localizes/integrates) an interrupt definition portion up to a portion where the interrupt actually occurs throughout the hierarchical structures. More specifically, the portion where the interrupt actually occurs is converted into a different structure that limits a range in which the interrupt is effective. In addition, the interrupt structure localizing section 26 is comprised of the sequential interrupt structure localizing section 28 and parallel interrupt structure localizing section 30. These sections take charge of different processes in accordance with a lower-level structure in which an interrupt occurs.

<Sequential Interrupt Structure Localizing Section>

The sequential interrupt structure localizing section 28 localizes an interrupt structure when a lower-level structure is a sequential structure (fsm). Assume that several rules to be described below are applied to localization. Note that the following rules are presented for the sake of convenience and can be changed in accordance with the embodiment, as needed.

Assume that behaviors A1 and A2 are behaviors free from interrupt, and behavior A3 is an interruptible behavior.

For example, with regard to the following specification
try{fsm{A1, A2}}trap(e){B} the sequential interrupt structure localizing section 28 obtains the following specification by localizing an interrupt according to (rule: remove any behavior free from an interrupt from the interrupt structure.)
fsm{A1, A2}

In this case, since the lower level of the above interrupt structure (try) is constituted by only behaviors A1 and A2 free from interrupts, the interrupt structure itself disappear as a result of localization. This indicates equivalent contents in terms of a system specification.

With regard to the following specification
try{fsm{A1, A3, A2}}trap(e){B} first of all, the sequential interrupt structure localizing section 28 obtains
fsm{A1, try{fsm{A3, A2}}trap(e){B}} by performing localization according to the above rule "remove any behavior free from an interrupt from the interrupt structure". The sequential interrupt structure localizing section 28 further localize the following portion
try{fsm{A3, A2}}trap(e){B} according to the following rules:
(rule: store operation after an interrupt)
(rule: insert recording/referring of branch information required to store operation in a specification)

As described above, behavior A3 is interruptible. Whether to execute A2 is determined depending on the occurrence of an interrupt with respect to behavior A3. More specifically, (1) If interrupt e occurs during execution of behavior A3, behavior A3 is stopped, and behavior B is executed. Behavior A2 is not executed.

(2) If interrupt e does not occur and behavior A3 is completed, behavior A2 is executed. Behavior B is not executed.

To store the contents of this specification, the sequential interrupt structure localizing section 28 localizes the interrupt structure as follows:
fsm{A1, {A3', flg==1:EXIT, flg!=1:A2}}
A3'=try{fsm{A3, flg=0}}trap(e){flg=1}

If an interrupt occurs during execution of behavior A3, fig (flag) is set to 1. If behavior A3 is completed without any interrupt, fig is set to 0. In this manner, an interrupt state is discriminated. Whether to execute or stop behavior A2 is determined according to the specification of fsm depending on the interrupt state and branch condition.

Figure 3:
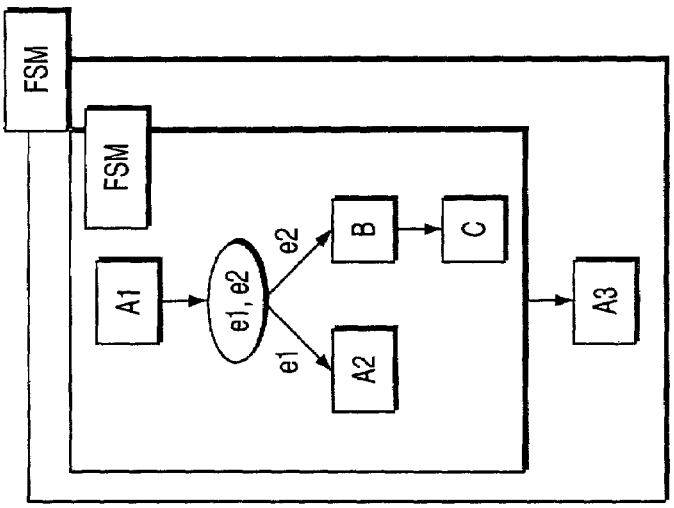
FIG. 3 is a view showing an example of localization of a sequential interrupt structure.
Figure 3:
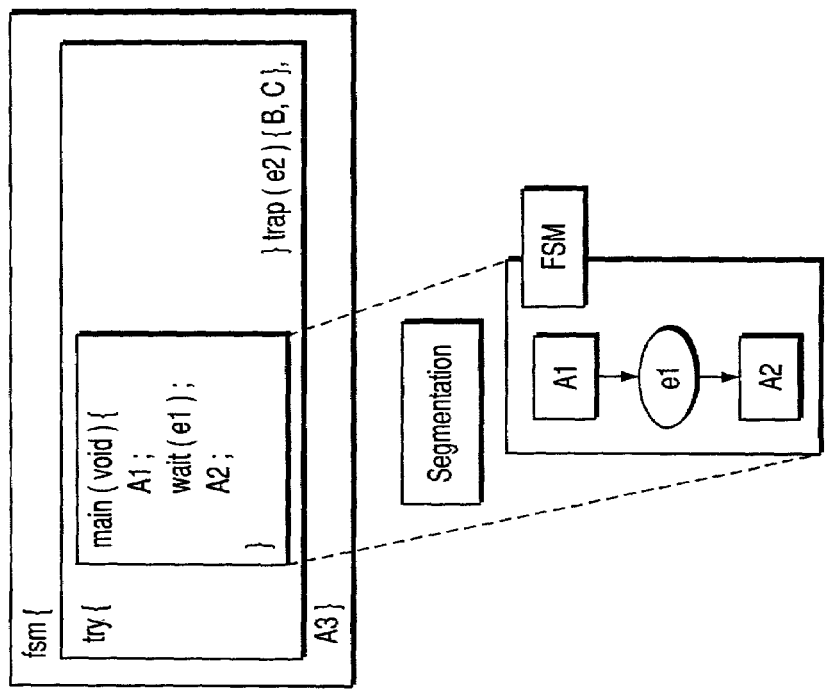

The localization of a sequential interrupt structure described above will be described below with reference to another example in FIG. 3. Referring to FIG. 3, the interruptible portion specifying section 22 specifies wait (e1) as an interruptible portion in the structure indicated by try{ }. As indicated by the lower part of FIG. 3, specification segmentation (specification segmenting section 24) is performed. As indicated by the right part of FIG. 3, localization is performed (sequential interrupt structure localizing section 28).

Figure 4:
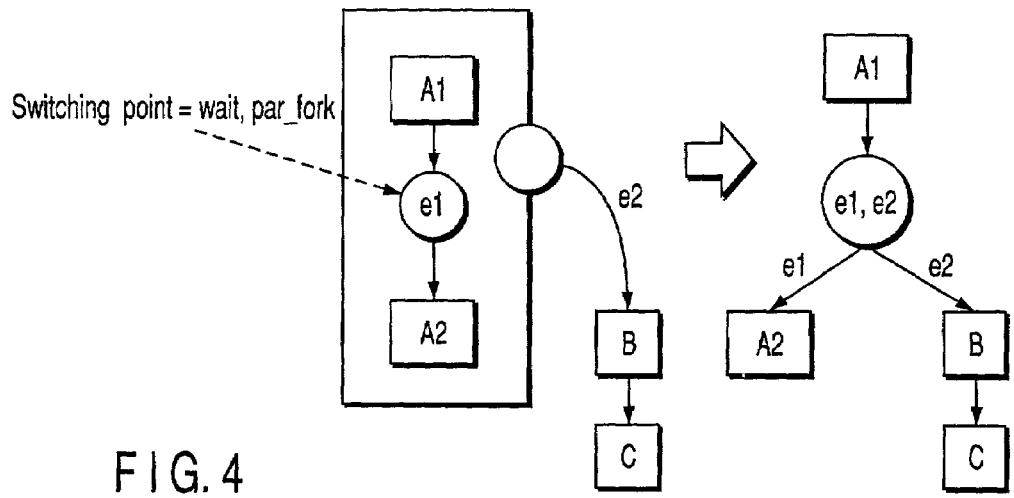
FIG. 4 is a view for explaining localization of an interrupt with respect to a segmented specification.

As shown in FIG. 4, the sequential interrupt structure after segmentation is localized such that after behavior A1 is executed, events e1 and e2 are set in a parallel wait state, and a transition is realized in accordance with the event that is effected first. The sequential interrupt structure localizing section 28 automatically creates such a specification structure.

Figure 5:
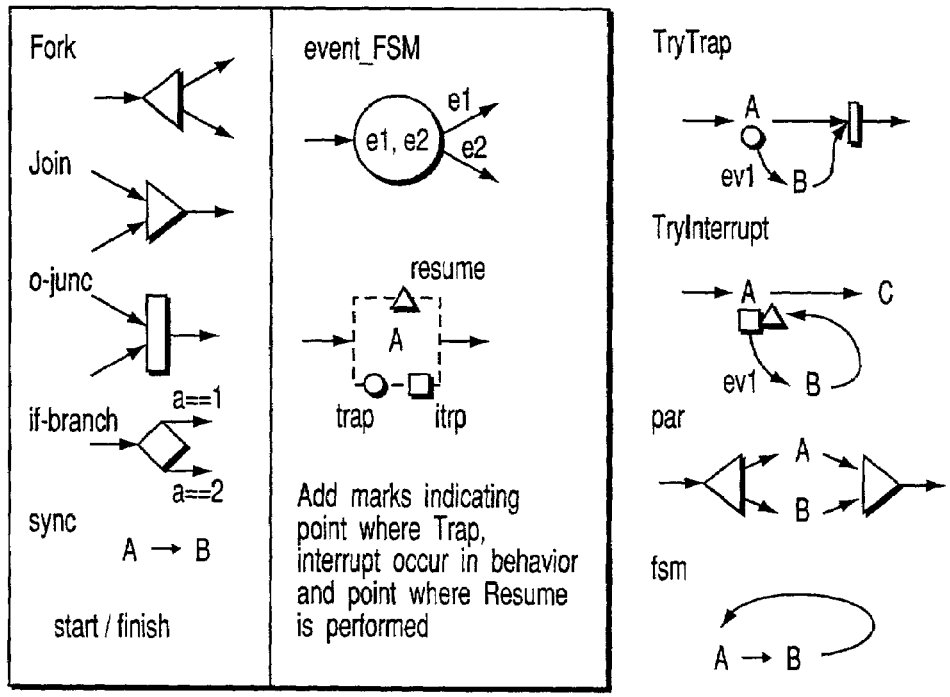
FIG. 5 is a view for explaining the ETG notation.

FIG. 5 is a view for explaining the ETG (Extended Task Graph) notation. The specification notation in the SpecC language described so far can be expressed in the ETG notation by adding the elements shown in FIG. 5.

Figure 6:
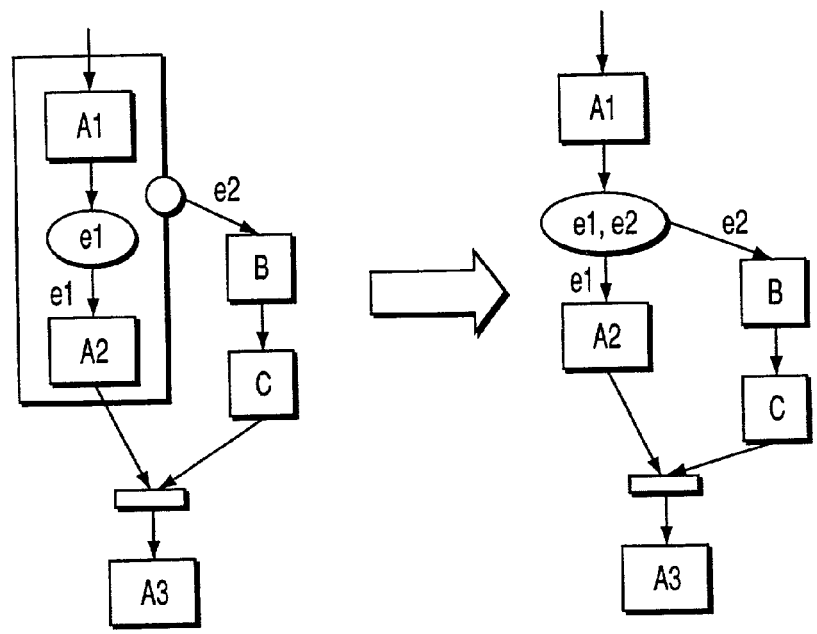
FIG. 6 is a view showing an example of localization of a sequential interrupt structure in the ETG notation.

FIG. 6 shows localization of a sequential interrupt structure in the SpecC language by using the ETG notation. Obviously, trap(e2) as an upper level is localized in association with an interruptible portion (e2) both in the SpecC language and ETG.

<Parallel Interrupt Structure Localizing Section>

Location of a parallel interrupt structure will be described next.

The parallel interrupt structure localizing section 30 localizes an interrupt structure when a lower-level structure is a parallel (par) structure.

Localization is performed according to the following rules:
(rule: cause an interrupt in each parallel structure)
(rule: determine an overall stop in accordance with an end state (end with an interrupt or end without any interrupt) at an interrupt portion)

Figure 7:
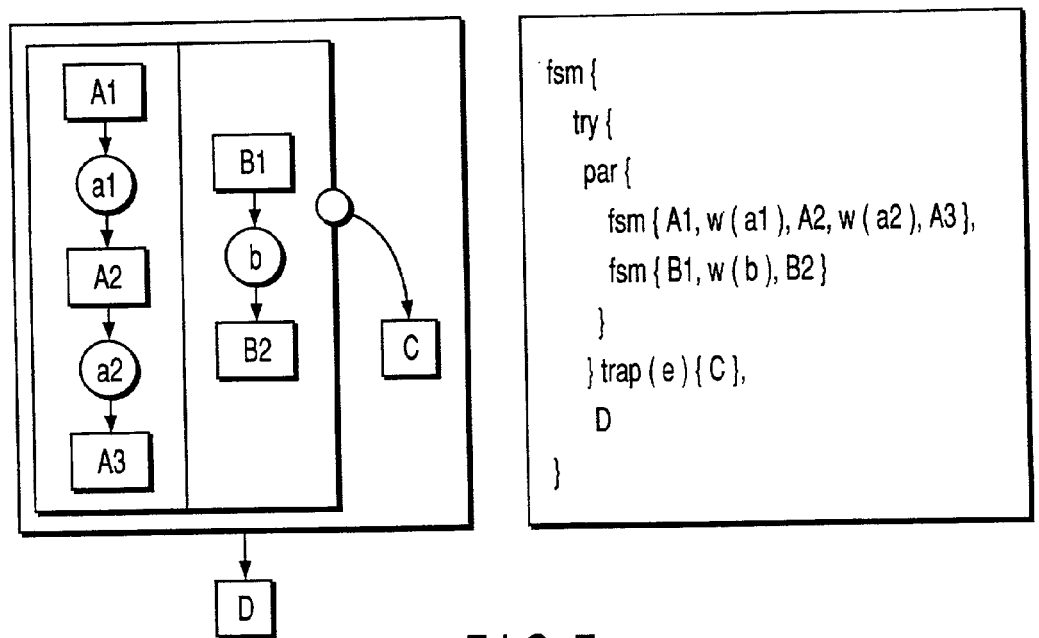
FIG. 7 is a view showing an example of localization of a parallel interrupt structure.

For example, in the following specification containing par (shown in FIG. 7 as well):

event e may occur at point wait(a1), wait(a2), and wait(b).

According to the above rules, first of all, the parallel interrupt structure localizing section 30 performs localization (development of parallel interrupt) so as to insert an interrupt structure in the internal structure (fsm structure) of the parallel structure (par).

In the above specification, in consideration of the following structure of try:

```
try{
    par{
        fsm{A1,wait(a1),A2,wait(a2),A3},
        fsm{B1,wait(b),B2}
    }
}trap(e) {C}
``` the following development is performed (parallel interrupt developing section 32):

```
par{
    try{
        fsm{A1,wait (a1),A2,wait (a2),A3}
    }trap(e) {flg=1},
    try{
        fsm{B1,wait (b),B2}
    }trap(e) {flg=1}
}
```

In this case, the parallel interrupt structure localizing section 30 determines the interrupt end states of behaviors A and B as follows:

```
par{
    fsm{
        {par{
            fsm{
                A1,
                {a1',flg==1:goto(1),flg!=1:goto(2)},
                {1|A2,goto (3)},
                {3|a2',flg==1:goto(4),f1g!=1:goto(2)},
                {4|A3,flg=0,:EXIT},
                {2|flg=1,:EXIT}
            },
            fsm{
                B1,
                {b1',flg==1:goto(1),flg!=1:goto(2)},
                {1|B2,flg=0,:EXIT},
                {2|flg=1,:EXIT}}},
            flg==0:fork_d1,flg!=0:fork_c}
        },
        fsm{join_c,C,fork_d2},
        fsm{wait(join_d1, join_d2),D}
    }
    }
}
```

Figure 8:
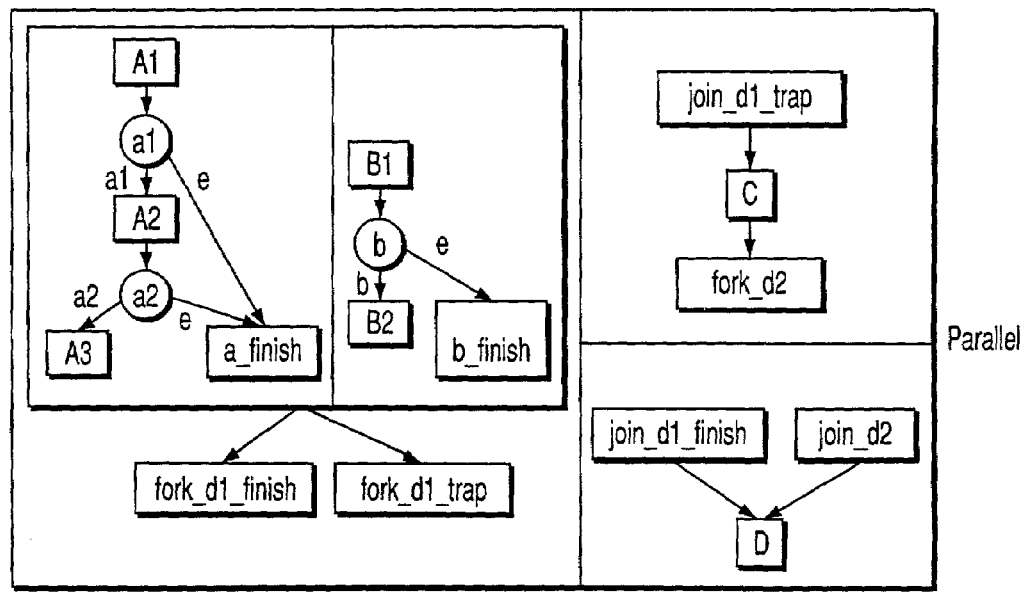
FIG. 8 is a view showing a localization result on the parallel interrupt structure.

FIG. 8 shows the location result on the above parallel interrupt structure. As is obvious from FIG. 8, localization is performed with respect to an interruptible portion (point) in par to develop the overall structure into one FSM.

<Parallel Interrupt Developing Section>

If an interruptible portion is obvious with respect to each parallel element in a parallel structure containing an interrupt, the parallel interrupt developing section 32 clarifies an interruptible portion in an overall structure obtained by combining these parallel elements.

Figure 9:
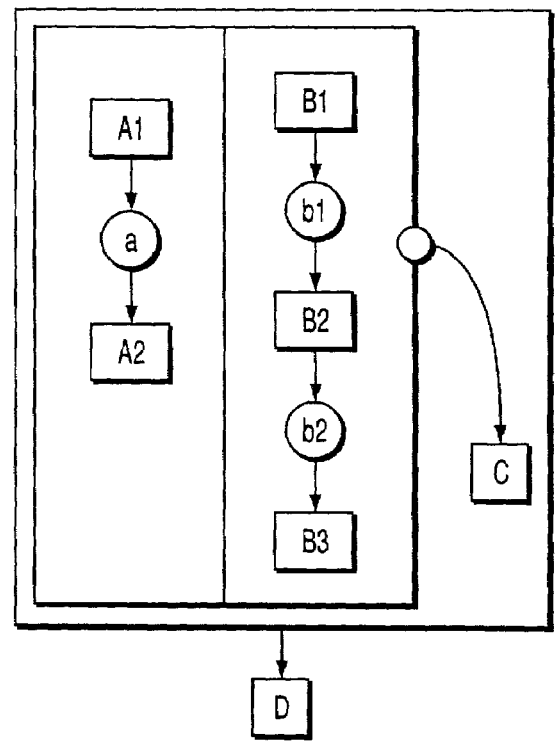
FIG. 9 is a view for explaining parallel synthesis in a parallel interrupt structure.
Figure 10:
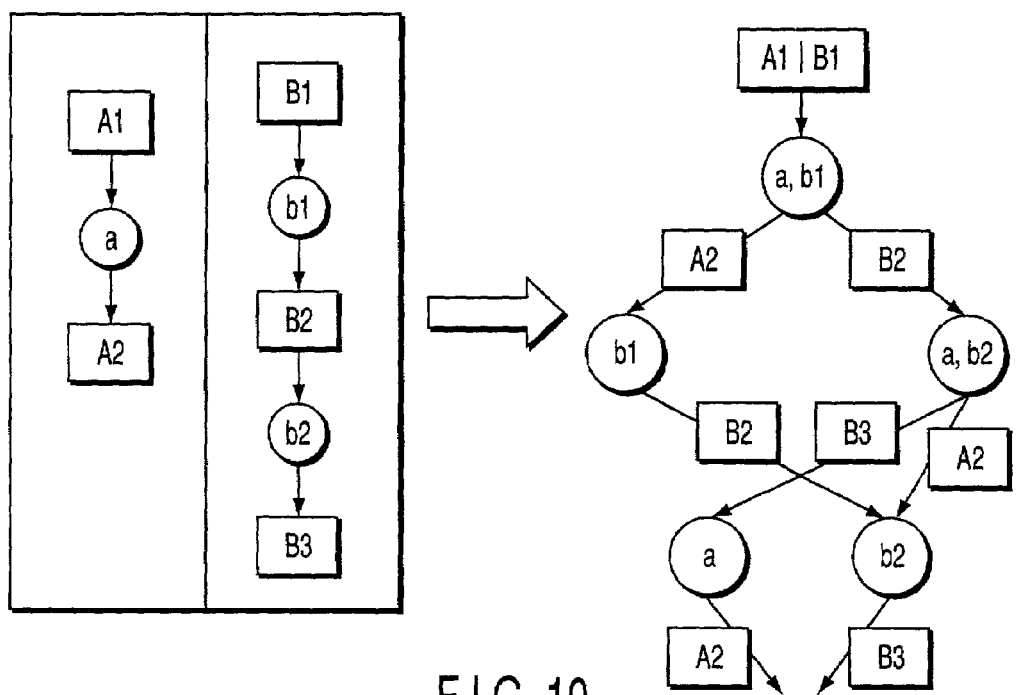
FIG. 10 is a view showing a parallel synthesis result on the parallel interrupt structure.
Figure 11:
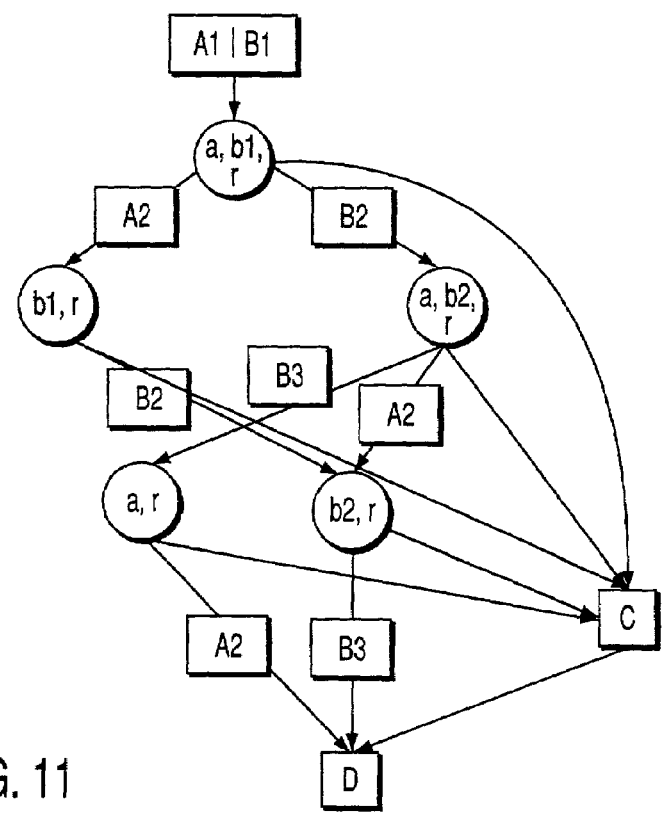
FIG. 11 is a view showing an interrupt development result on the parallel synthesis result.

For example, as shown in FIG. 9, if an interrupt (try/trap/intrp) structure contains a parallel structure (par) as a lower-level structure, the parallel interrupt developing section 32 obtains FSM like a lattice structure by performing parallel synthesis like that shown in FIG. 10. FIG. 11 shows a structure in which an interrupt is set for each parallel structure (par).

<Parallel Interrupt Separating Section>

The parallel interrupt separating section 33 performs the exact opposite function to the parallel interrupt developing section 32. That is, the parallel interrupt separating section 33 converts a structure having one interrupt structure into two structures to be executed parallel. If the opposite function to interrupt structure localization is not performed, the parallel interrupt separating section 33 is not required.

The localization of the parallel interrupt structure described above can also be described in ETG as in the case of sequential interrupt structure localization. FIGS. 12 to 14 show the parallel interrupt structure in FIG. 7 in the ETG notation.

FIG. 13 shows the result obtained by setting an interrupt structure for each parallel structure in the specification structure shown in FIG. 12. FIG. 14 shows the result obtained by performing parallel synthesis of the parallel structures in FIG. 13 into one structure using the parallel interrupt developing section 32. Referring to FIG. 14, behaviors A1 and B1 are portions where scheduling (formation of fsm) can be performed.

Figure 15:
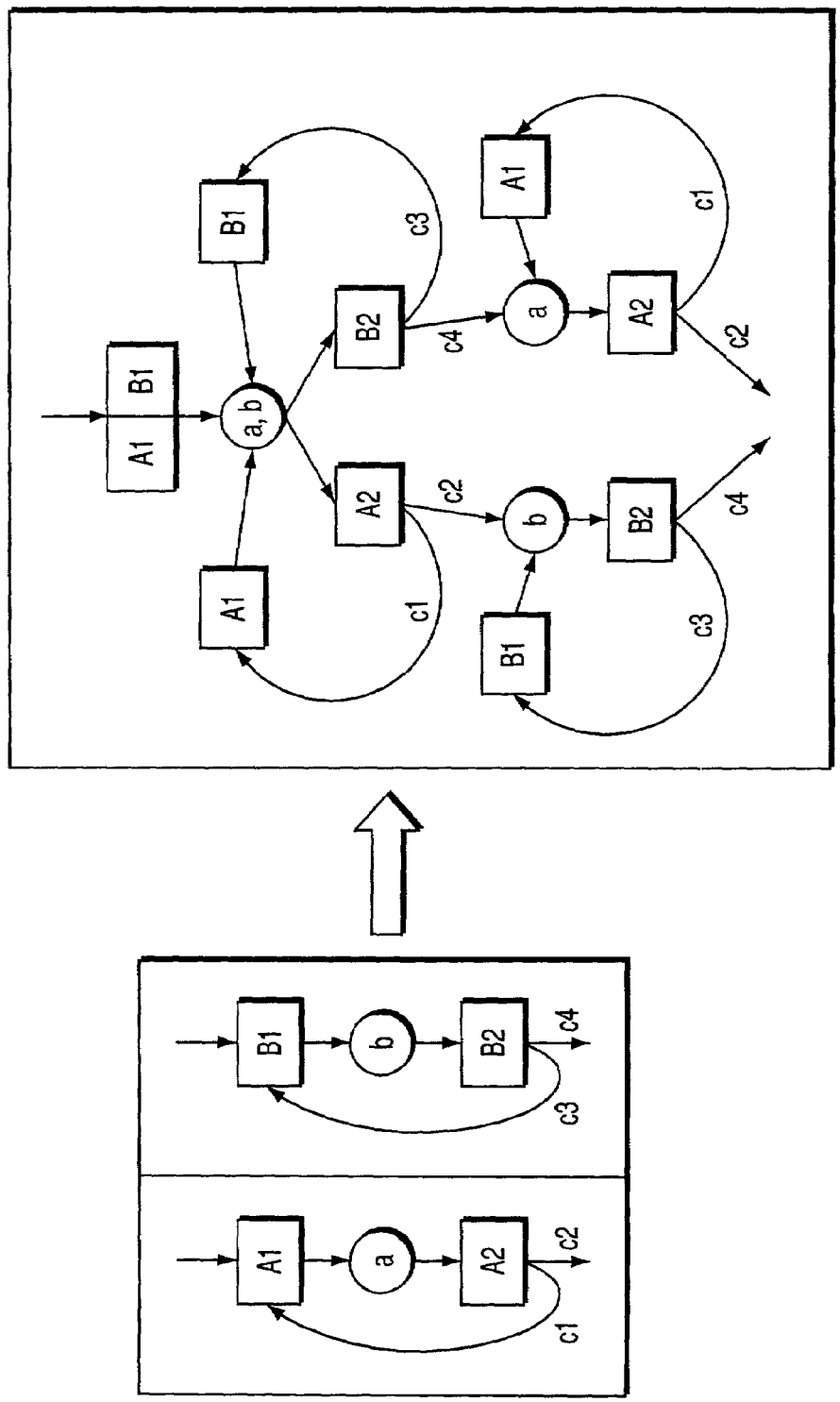
FIG. 15 is a view showing a localization result on a parallel interrupt structure containing a loop structure.

Obviously, even if the above parallel interrupt structure contains a loop structure, localization can be properly performed on the analogy of the above description. FIG. 15 shows the result obtained by localizing such a structure containing a loop structure.

According to the interrupt structure localizing apparatus of this embodiment described above, the interruptible portion specifying section 22 specifies a portion (point) where an interrupt actually occurs, the specification segmenting section 24 segments the specification at the specified portion as a boundary, and the interrupt structure localizing section 26 localizes the segmentation result. As a result, a specification structure can be obtained, in which an interrupt does not occur across hierarchical structures. This makes it possible to avoid difficulty in efficiently implementing an interrupt in a specification created in a system description language in such a case where the interrupt is defined at a lower level which is structurally separate from a portion where the interrupt actually occurs.

A method and apparatus can therefore be provided, which are suitably used to detail a system-level specification created in a system description language and localize an interrupt structure contained in a structural system-level specification.

Each function described above can be implemented as software.

In addition, this embodiment can be practiced as a program for causing a computer to execute predetermined means (or causing the computer to function as predetermined means or to realize predetermined functions) or a computer-readable recording medium on which the program is recorded.

Additional advantages and modifications will readily occur to those skilled in the art. Therefore, the invention in its broader aspects is not limited to the specific details and representative embodiments shown and described herein.

Accordingly, various modifications may be made without departing from the spirit or scope of the general inventive concept as defined by the appended claims and their equivalents.

What is claimed is:

1. A method for localizing an interruption structure included in a hierarchical structure of a specification described in a system description language and stored in a storage unit, the method comprising:
specifying at least one interruption point in a hierarchical structure of the specification stored in the storage unit using a syntactic analyzer;
segmenting the specification into a plurality of segmented parts at the specified interruption point, the segmented parts being classified into at least one non-interruptible part and at least one part formed of only a minimum interruptible structure, said minimum interruptible structure having a level lower in the hierarchical structure than a level in the hierarchical structure at which the interruption point is defined; and
localizing the minimum interruptible structure up to an interruption point, said minimum interruptible structure comprising one of a sequential structure and a parallel structure in the lower-level of the hierarchical structure.

2. The method according to claim 1, wherein when the minimum interruption structure comprises the parallel structure, a parallel structure handling an interrupt expands to the sequential structure.

3. The method according claim 2 further comprising, converting the expanded sequential structure to the interruption structure having the parallel structure.

4. The method according to claim 1, wherein the specification is described by using, as elements, processing units and communication channels for communication between the processing units,
an overall control specification is described by a hierarchical combination of control structures using at least sequential execution, parallel execution, interrupt execution, and repetitive execution as a processing execution control scheme, and
a flow of data is described by combining the processing units through the communication channels.

5. The method according to claim 4, wherein the specification includes a description about exchange and synchronous processing of events between not less than two processing units to be concurrently executed.

6. An interruption structure localizing apparatus for localizing an interruption structure included in a hierarchical structure of a specification described in a system description language, comprising:
a storage unit configured to store a specification described in a system description language;
a syntactic analyzer configured to specify an interruption point in the hierarchical structure of the specification stored in the storage unit;
a segmenting unit configured to segment the specification into a plurality of segmented parts at the specified interruptible point, the segmented parts being classified into at least one non-interruptible part and at least one part formed of only a minimum interruptible structure, said minimum interruptible structure having a level lower in the hierarchical structure than a level in the hierarchical structure at which the interruption structure of the specification is defined; and
a localizing unit configured to localize the minimum interruptible structure up to an interruption point where an interrupt actually occurs through the hierarchical structure, by computation, said minimum interruptible structure comprising one of a sequential structure and a parallel structure.

7. The apparatus according to claim 6, wherein when the structure of the specification in the lower-level of the hierarchical structure has the parallel structure, the parallel structure each handling an interrupt expands to the sequential structure.

8. The apparatus according claim 7 further comprising, means for converting the expanded sequential structure to the interruption structure having the parallel structure.

9. The apparatus according claim 6, wherein the specification is described by using, as elements, processing units and communication channels for communication between the processing units,
an overall control specification is described by a hierarchical combination of control structures using at least sequential execution, parallel execution, interrupt execution, and repetitive execution as a processing execution control scheme, and
a flow of data is described by combining the processing units through the communication channels.

10. The apparatus according claim 9, wherein the specification includes a description about exchange and synchronous processing of events between not less than two processing units to be concurrently executed.

11. A computer program product comprising:
a computer-readable recording medium and a computer program code mechanism embedded in the computer-readable recording medium for causing a computer to localize an interruption structure included in a hierarchical structure of a specification described in a system description language, the computer program code mechanism comprising:
a computer code device configured to specify an interruptible point in the hierarchical structure of the specification in a storage unit,
a computer code device configured to segment the specification into a plurality of segmented parts at the specified interruptible point, the segmented parts being classified into at least one non-interruptible part and at least one part formed of only a minimum interruptible structure, said minimum interruptible structure having a lower-level in the hierarchical structure than a level of the hierarchical structure at which the interruption structure of the specification is defined; and
a computer code device configured to localize the minimum interruptible structure up to an interruption point where an interrupt actually occurs throughout the hierarchical structure, by computation, said minimum interruptible structure including one of a sequential structure and a parallel structure in the lower-level of the hierarchal structure.

12. A computer program product according to claim 11, wherein when the structure of the specification in the lower level of the hierarchical structure have the parallel structure, the parallel structure each handling an interrupt expands to the sequential structure.

13. A computer program product according to claim 12 further comprising:
a computer code device configured to convert the expanded sequential structure to the interruption structure having the parallel structure.

14. A computer program product according to claim 11, wherein the specification is described by using, as elements, processing units and communication channels for conimunication between the processing units, an overall control specification is described by a hierarchical combination of control structures using at least sequential execution, parallel execution, interrupt execution, and repetitive execution as a processing execution control scheme, and a flow of data is described by combining the processing units through the communication channels.

15. A computer program product according to claim 14, wherein the specification includes a description about exchange and synchronous processing of events between not less than two processing units to be concurrently executed.

* * * * *